United States Patent
Ouacha

(10) Patent No.: US 6,900,695 B2
(45) Date of Patent: May 31, 2005

(54) RECONFIGURABLE BROADBAND ACTIVE POWER SPLITTER DITTO POWER COMBINER AND DITTO BIDIRECTIONAL POWER SPLITTER/POWER COMBINER AND CIRCUITS BASED ON THESE

(75) Inventor: Aziz Ouacha, Atvidaberg (SE)

(73) Assignee: Totalforsvarets Forskningsinstitut, Stockholm (SE)

( * ) Notice: Subject to any disclaimer, the term of this patent is extended or adjusted under 35 U.S.C. 154(b) by 63 days.

(21) Appl. No.: 10/416,504

(22) PCT Filed: Nov. 20, 2001

(86) PCT No.: PCT/SE01/02562

§ 371 (c)(1),
(2), (4) Date: May 20, 2003

(87) PCT Pub. No.: WO02/41442

PCT Pub. Date: May 23, 2002

(65) Prior Publication Data

US 2004/0041632 A1 Mar. 4, 2004

(30) Foreign Application Priority Data

Nov. 20, 2000 (SE) ............................................. 0004242

(51) Int. Cl.$^7$ ................................................ H03F 3/68
(52) U.S. Cl. ......................... 330/295; 330/54; 330/286
(58) Field of Search ......................... 330/54, 147, 277, 330/307, 286, 295

(56) References Cited

U.S. PATENT DOCUMENTS 4,973,918 A    11/1990  Schindler .................... 330/277
5,027,084 A  * 6/1991  Tsukii ......................... 330/295
5,361,038 A    11/1994  Allen et al. ................... 330/54
5,504,745 A  * 4/1996  Petz et al. .................... 370/480

FOREIGN PATENT DOCUMENTS

FR          2 759 508         8/1998

\* cited by examiner

Primary Examiner—Dinh T. Le
(74) Attorney, Agent, or Firm—Jacobson Holman PLLC

(57) ABSTRACT

A distribution network which can be an active power splitter or an active power combiner or alternatingly power splitter and such a power combiner. The power splitter consists of two distributed amplifiers with a common input and one output each, and the power combiner consists of two distributed amplifiers with one input each and a common output. For the power splitter, a switching element is connected between each connection point on the outputs of the amplifying elements and ground, and for said power combiner, a switching element is connected between each connection point on the inputs of the amplifying elements and ground, the switching elements being optimised to take, depending on a control voltage, one of two distinct states. A first state corresponding to a capacitance and a second state corresponding to a low impedance short circuit. This implies that when the control voltage is high for a distributed amplifier, this amplifier transmits power, and, when the control voltage is low for a distributed amplifier, this amplifier does not transmit power. The invention also relates to a multifunctional broadband electronically steered phased array system comprising at least one power splitter or power combiner as stated above.

15 Claims, 18 Drawing Sheets

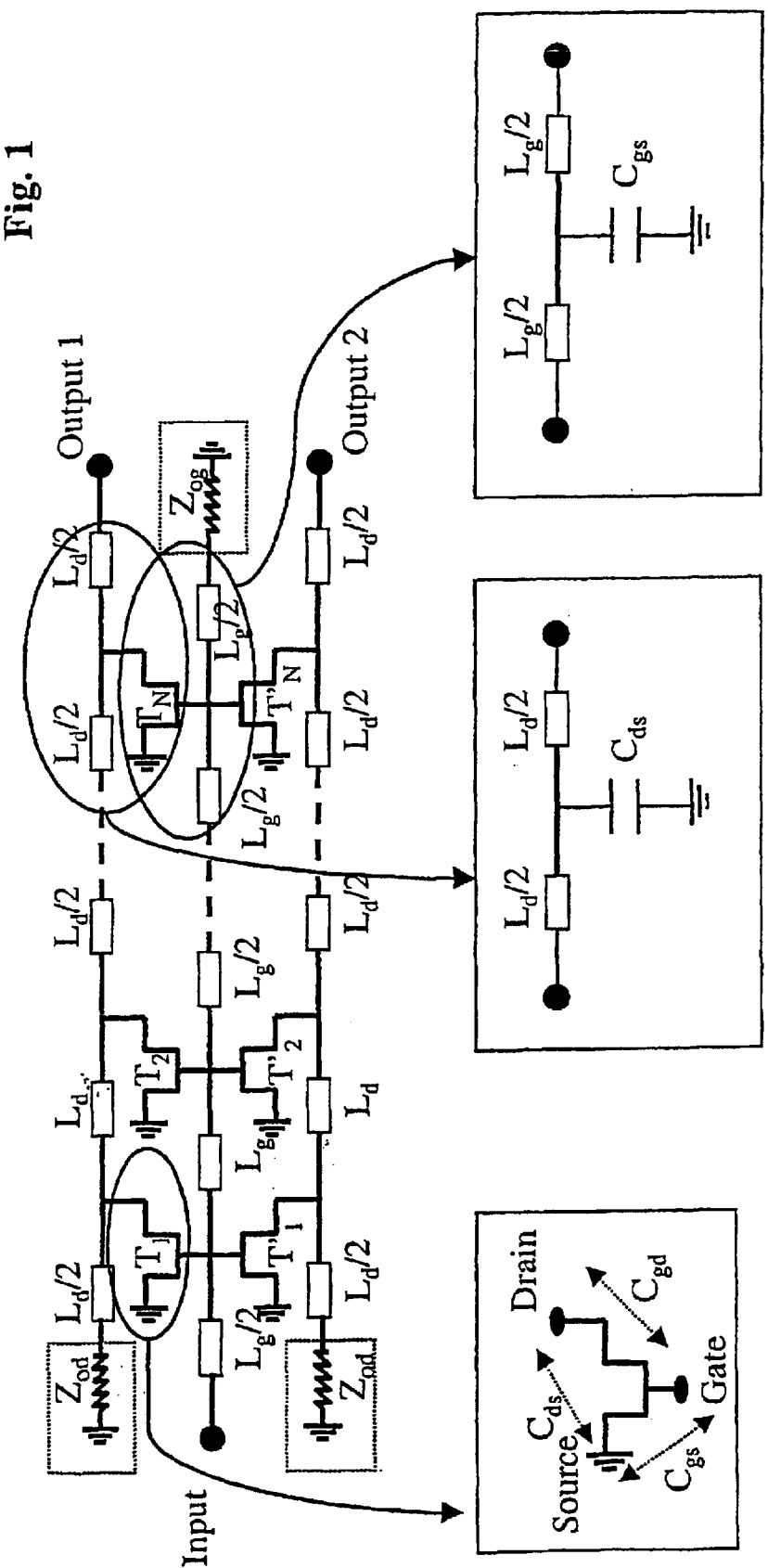

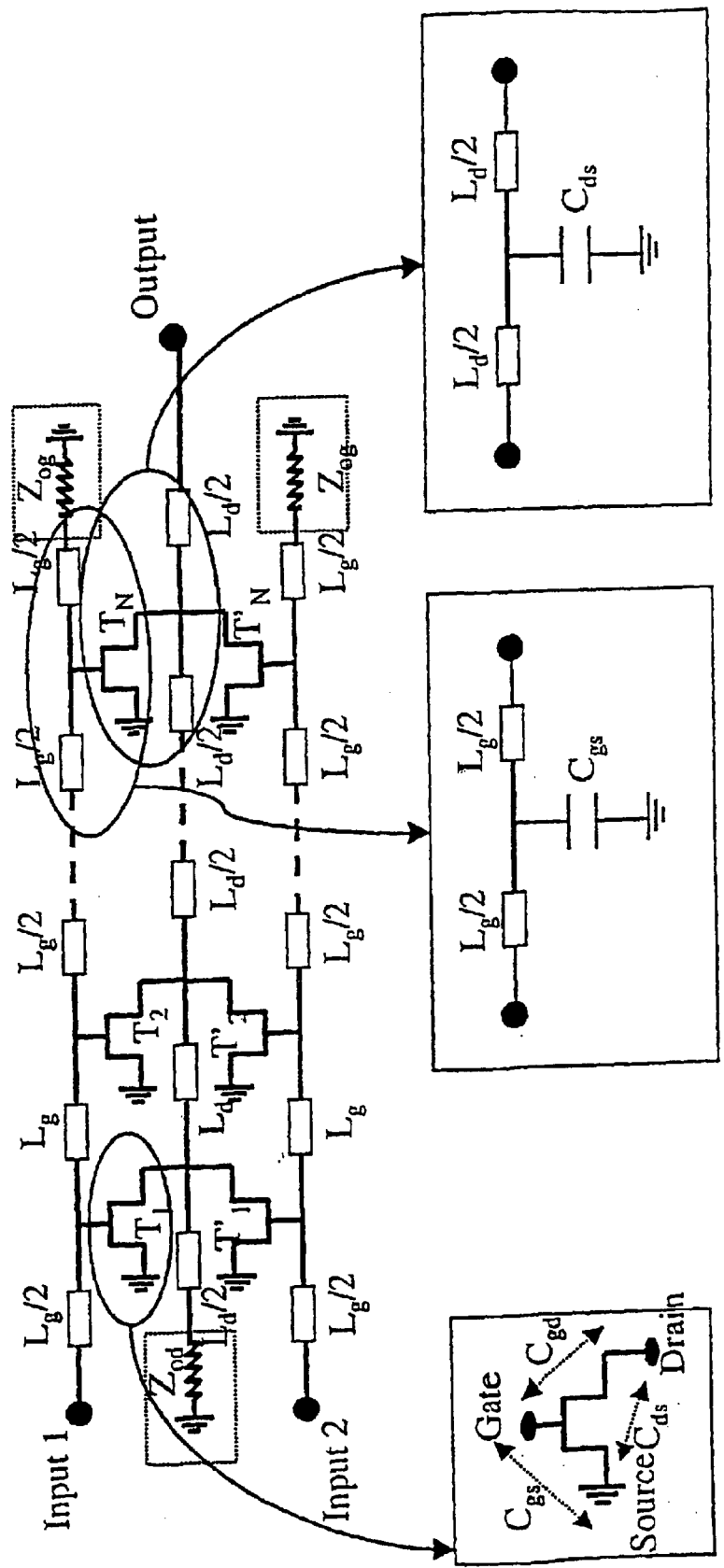

MFAM

US 6,900,695 B2

RECONFIGURABLE BROADBAND ACTIVE POWER SPLITTER DITTO POWER COMBINER AND DITTO BIDIRECTIONAL POWER SPLITTER/POWER COMBINER AND CIRCUITS BASED ON THESE

This is a nationalization of PCT/SE01/02562 filed Nov. 20, 2001 and published in English.

BACKGROUND OF THE INVENTION

The present invention relates to a reconfigurable broadband active power splitter, a ditto power combiner and a ditto bidirectional power splitter/power combiner and circuits based on these. Use of such circuits in an analog distribution network enables good insulation between different channels in combination with amplification in the distribution network. The latter reduces the requirements for subsequent amplification, which facilitates dynamics and linearity properties. It is important that the invention is ultra broadband, and that, by using MMIC technology, the circuit surface size can become small.

The invention is manifested in its basic form in a reconfigurable broadband active power splitter, a corresponding power combiner and a corresponding bidirectional power splitter/power combiner. These basic circuits can be combined in gradually more complex circuits, with several inputs and outputs.

BRIEF SUMMARY OF THE INVENTION

The starting point of the invention is a reconfigurable beam-forming network in a military application. Examples of this will be presented below. The basic circuits included, as well as the gradually more complex distribution networks that will be presented in this patent specification, can, however, be used in many other contexts where there is a need for power splitter and combiner. This is obvious to a person skilled in the art. It is therefore the applicant's explicit intention that the patent protection for the stated circuits having the stated properties should relate to their construction independently of where they are being used. In the now presented most complicated composition of subcircuits, also a completely reconfigurable beam-forming network is included, which will be presented in a claim.

Future military platforms will be provided with a combined system for radar, communication and electronic warfare (EW). It will be of interest to provide the system with a common set of beam-forming network, transceiver module and antenna (Single RF System). An antenna which is convenient in the context is a broadband multifunctional phased array antenna. Known analog beam-forming networks cannot be reconfigured in a simple manner so that the desired multifunctionality is achieved. It is also desirable, with an analog beam-forming network, to have a possibility of performing also a digital beam-forming.

In the invention, this is achieved by reconfigurably beam-forming networks having the design that is apparent from one of the independent claims. At the same the network is composed of gradually less complex distribution networks, down to a reconfigurable broadband active power splitter, a ditto power combiner and a ditto bidirectional power splitter/power combiner. These distribution networks solve, at their different levels, the current problems by having the design that is evident from the respective appended claims.

BRIEF DESCRIPTION OF THE SEVERAL VIEWS OF THE DRAWINGS

The invention will be described in more detail below with reference to the accompanying drawings, in which FIG. 1 shows a conventional distributed power splitter with artificial transmission lines on the inputs and outputs of the amplifying steps, FIG. 1a shows the inner capacitances between the connections of the transistors in FIG. 1, FIG. 1b shows an artificial transmission line for the output of the transistors in FIG. 1, FIG. 1c shows an artificial transmission line for the input of the transistors in FIG. 1, FIG. 2 shows a conventional distributed power combiner with artificial transmission lines on the inputs and outputs of the amplifying steps, FIG. 2a shows the inner capacitances between the connections of the transistors in FIG. 2, FIG. 2b shows an artificial transmission line for the input of the transistors in FIG. 2, FIG. 2c shows an artificial line transmission line for the output of the transistors in FIG. 2.

DETAILED DESCRIPTION OF THE INVENTION

Figure 4:
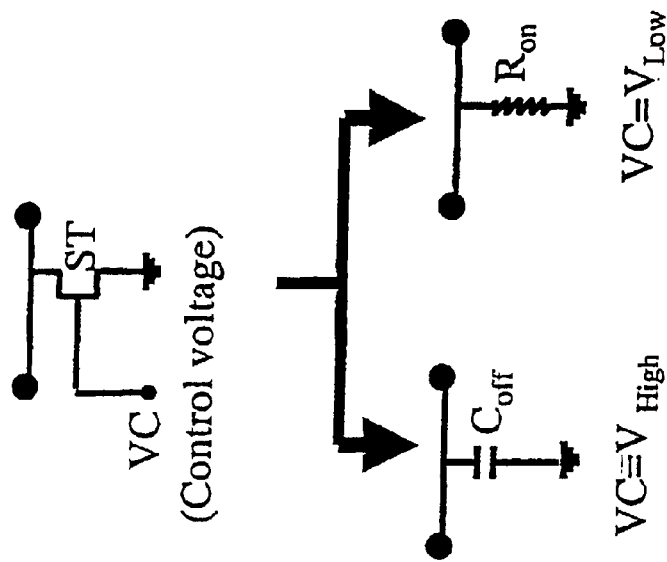
FIG. 4 shows the two states a switch transistor can take depending on its control voltage.

First the basic circuits will be discussed. They are constructed using distributed technique. The great advantage of this is that it gives the possibility of obtaining broadband function. FIG. 1 shows a conventional distributed power splitter and FIG. 2 a corresponding combiner. A conventional distributed power splitter can also be seen as two distributed amplifiers with a common input Basically, a distributed amplifier consists of a number of amplifying steps in the form of amplifying elements and artificial transmission lines on the inputs and outputs of the amplifying elements. The Figures illustrate amplifying elements in the form of transistors $T_1, \ldots, T_N$, and $T'_1, \ldots, T'_N$. A person skilled in the art finds no difficulty in replacing the individual transistors in the Figure with other known solutions, for instance in the form of two transistors instead of one for each amplifying element. The transistors in the examples of the Figures can advantageously be field effect transistors.

The transmission lines consist of series inductances $L_d$ and $L_g$ as well as parallel capacitances in the form of the inner capacitances $C_{ds}$ and $C_{gs}$ of the transistors, see FIGS. 1a and 2a. A transmission line connected to the input of the transistors is here called gate line, see FIGS. 1c and 2b, since it is connected to the gate of a transistor. A transmission line connected to the output of the transistors is here called drain line, see FIGS. 1b and 2c, since it is connected to the drain of a transistor.

For the signal from an amplifying step to be added constructively to the next, the phase response between the steps must be the same. Thus the broadband behaviour is achieved by the group delay for the gate line and the two drain lines being made identical. The bandwidth is limited upwards by the cut-off frequency of the lines and by the possibility of terminating the lines efficiently at all frequencies. The latter is due to the fact that the transmission lines have a frequency-dependent characteristic impedance that is to be terminated. The bandwidth is limited downwards by difficulties in adjusting the high resistances at the gate to a reasonable consumption of surface.

The number of amplifying steps further determines the total amplification that can be obtained from the input to the respective output. The number of steps is in practice limited since parasitic resistances of the transistors contribute to the attenuation in the lines, which will finally exceed the increase in amplification that is obtained by means of an extra step. Usually, the maximum is obtained at 6–7 steps.

The cut-off frequency $f_c$ is given by $$f_c = \frac{1}{\pi\sqrt{L_g C_{gs}}}$$

for gate line, see FIGS. 1c and 2b, and $$f_c = \frac{1}{\pi\sqrt{L_d C_{ds}}}$$

for drain line, fee FIGS. 1b and 2c.

The gate line constitutes an artificial LC connection. In its simplest form, it is a low pass filter with a constant parameter $$K_g = \frac{L_g}{C_{gs}}.$$

Similarly, the drain line constitutes an artificial LC connection. In its simplest form, it is a low pass filter with a constant parameter $$K_d = \frac{L_d}{C_{ds}}.$$

To achieve broadband properties, the gate line and the drain line must have identical characteristic impedances and identical phase velocities, which gives the following equations $$K_g = K_d \tag{1}$$

and $$L_g C_{gs} = L_d C_{ds} \tag{2}.$$

Figure 3:
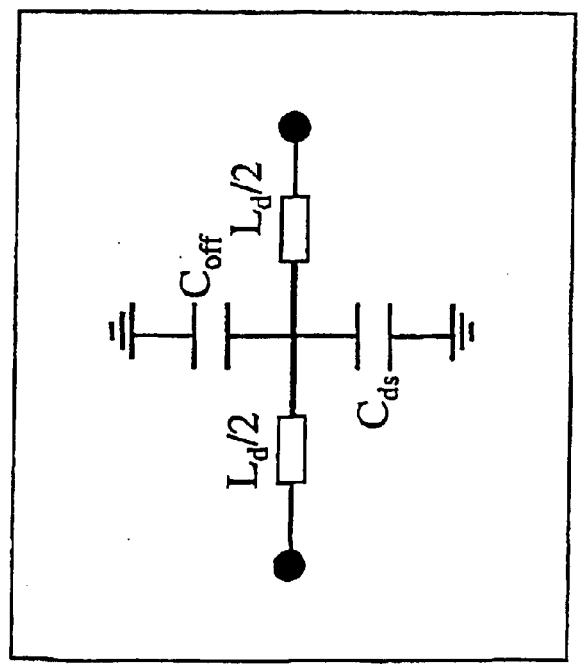
FIG. 3 shows how a shunt capacitance is connected to earth in an artificial transmission line.

In practice, $C_{gs}$ is greater than $C_{ds}$, and two methods can be used to make the phase velocity identical in gate line and drain line:

1. When it is desirable for $L_g$ and $L_d$ to be identical, an extra shunt capacitance $C_{off}$ can be connected parallel with $C_{ds}$ so that the total capacitance equals $C_{gs}$ and the equations (1) and (2) will be satisfied. This is shown in FIG. 3.

2. If it is not desirable to use a shunt capacitance, a series inductance $\alpha L_d$ is connected to the drain of the transistor and $L_d$ is selected so that the same phase velocity is obtained in the gate line and the drain line.

The new and actual basis for the present invention is that the shunt capacitance in method 1 is replaced with a switching element which is optimised, depending on a control voltage, to take two distinct states, a first corresponding to a capacitance $C_{off}$ and a second state corresponding to a low impedance short circuit $R_{on}$, see FIG. 4. The switching elements can advantageously be field effect transistors.

Figure 5:
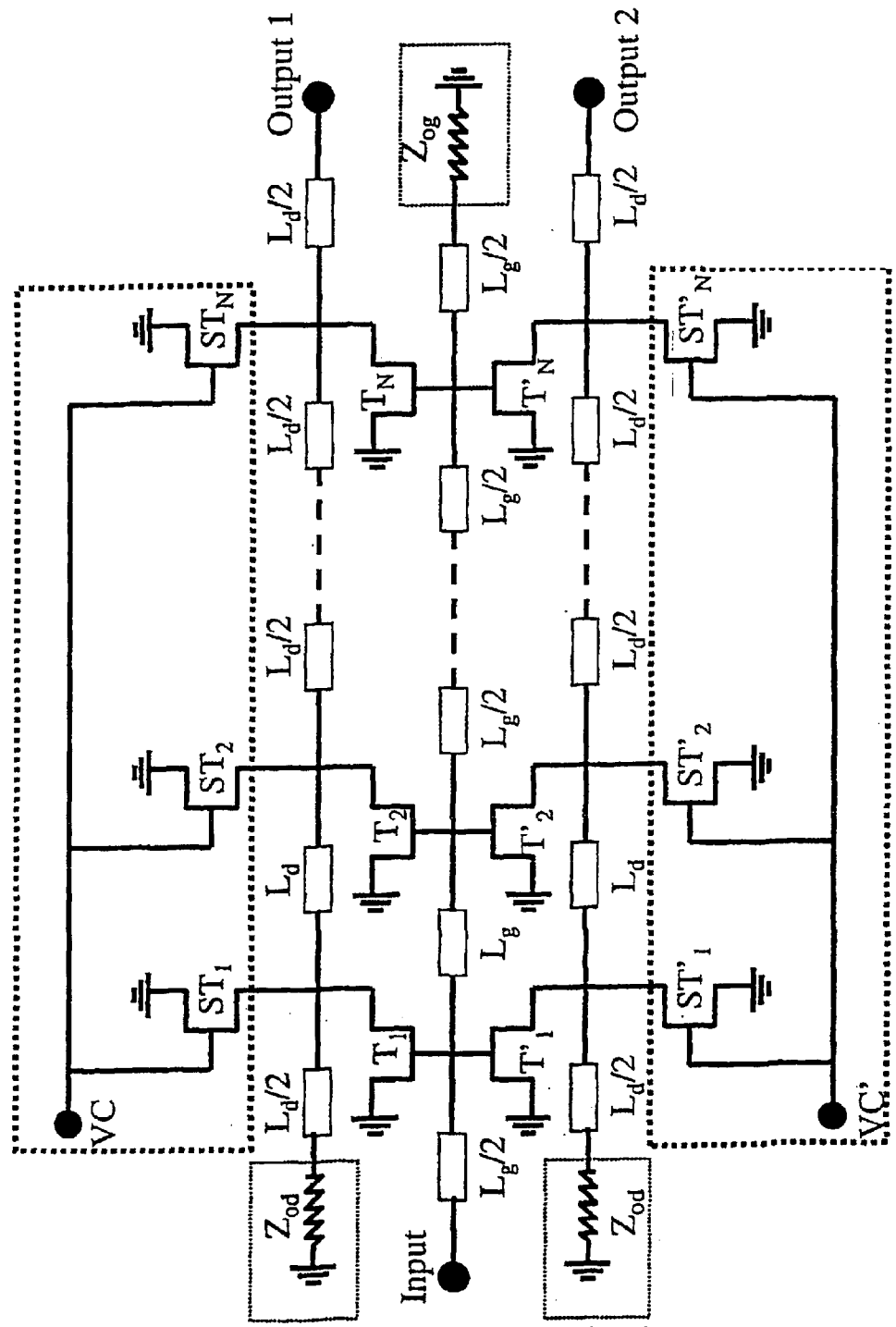
FIG. 5 shows a r configurable active power splitter FC1A according to the invention.
Figure 6A:
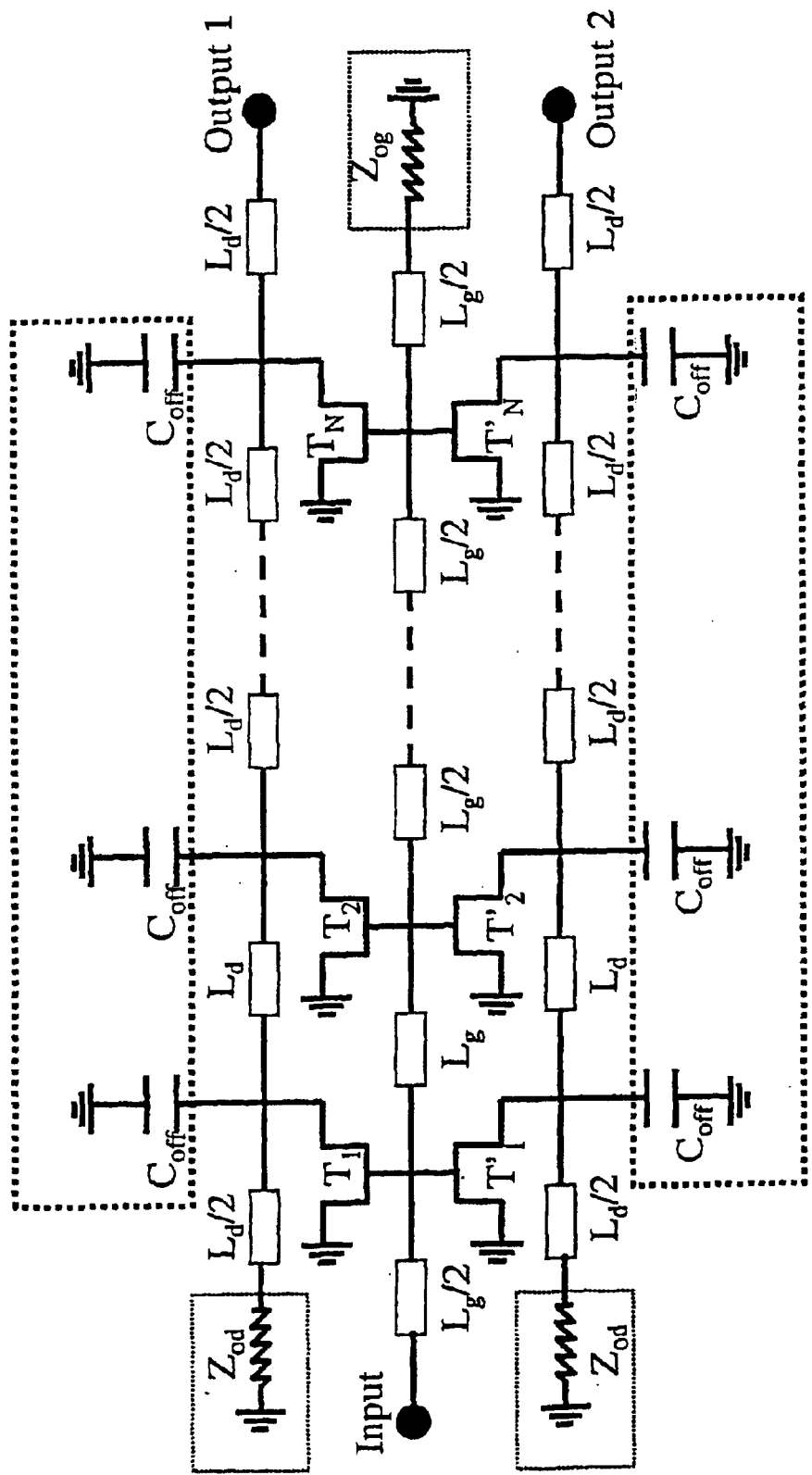
FIG. 6a shows how the power splitter in FIG. 5 is operated as a conventional active broadband power splitter ($VC=V_{High}$, $VC'=V_{High}$)
Figure 6B:
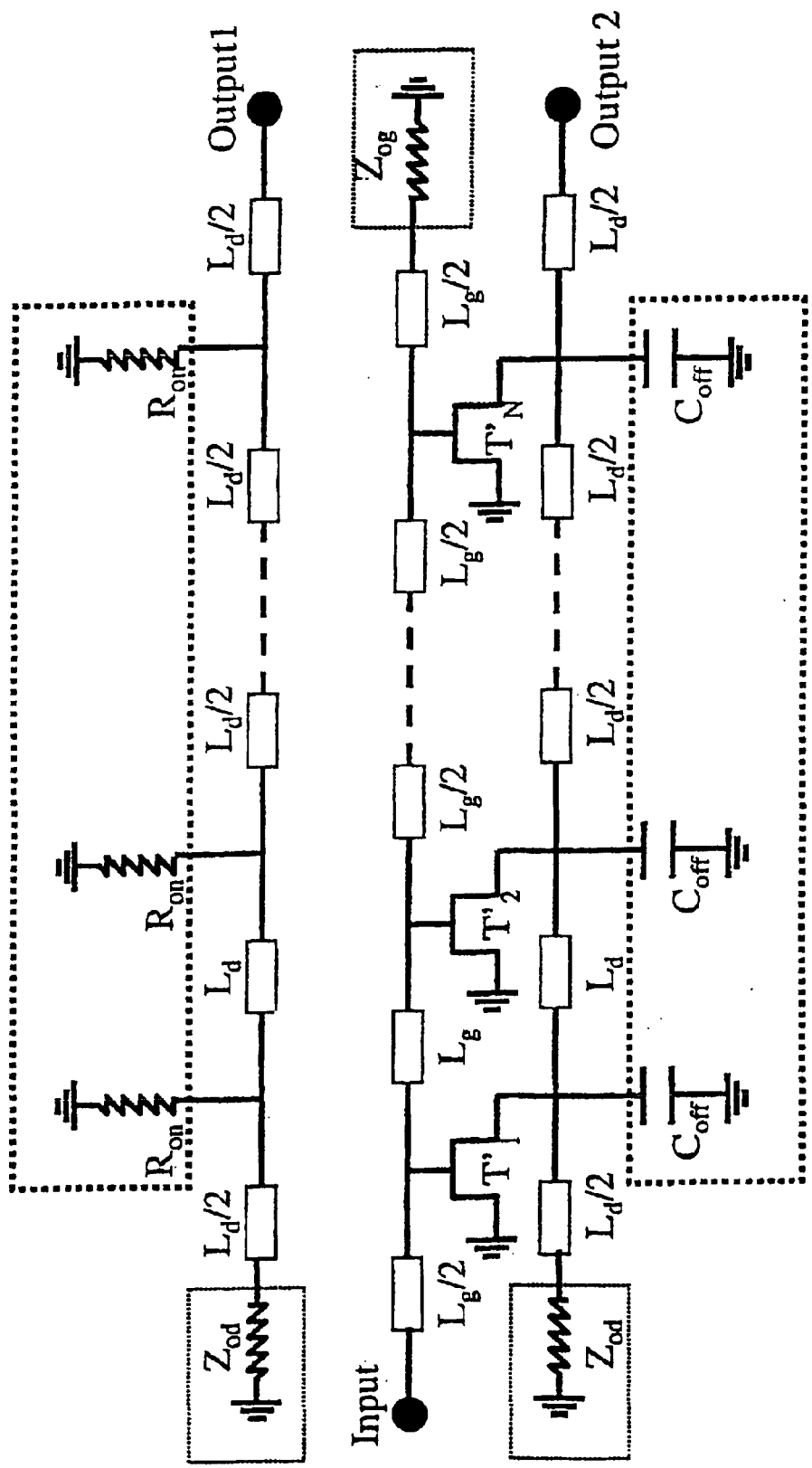
FIG. 6b shows how output port 1 in the power splitter in FIG. 5 is shunted, so that power reaches only output port 2 ($VC=V_{Low}$, $VC'=V_{High}$)
Figure 6C:
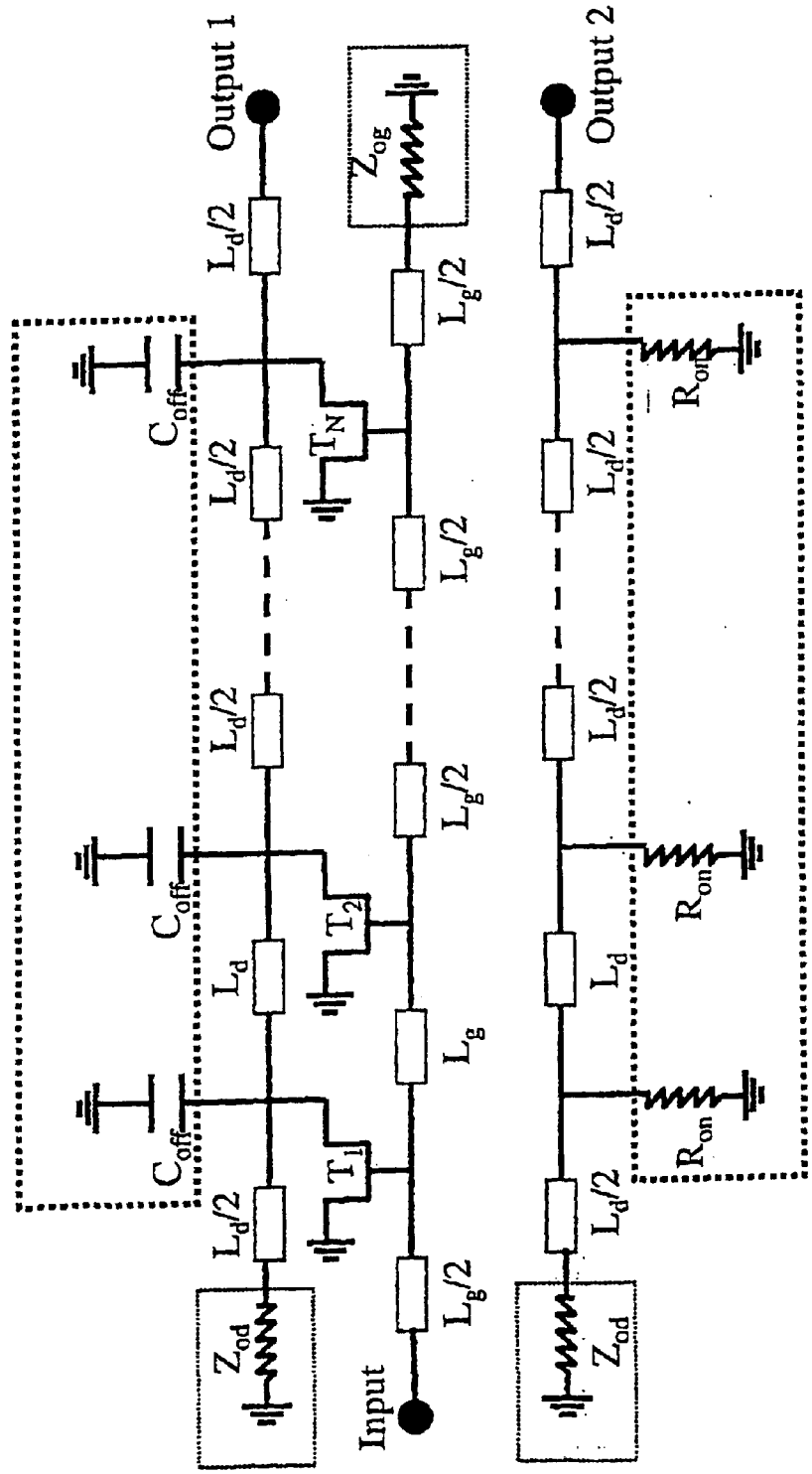
FIG. 6c shows how output port 2 in the power splitter in FIG. 5 is shunted so that power reaches only output port 1 ($VC=V_{High}$, $VC'=V_{Low}$)
Figure 6D:
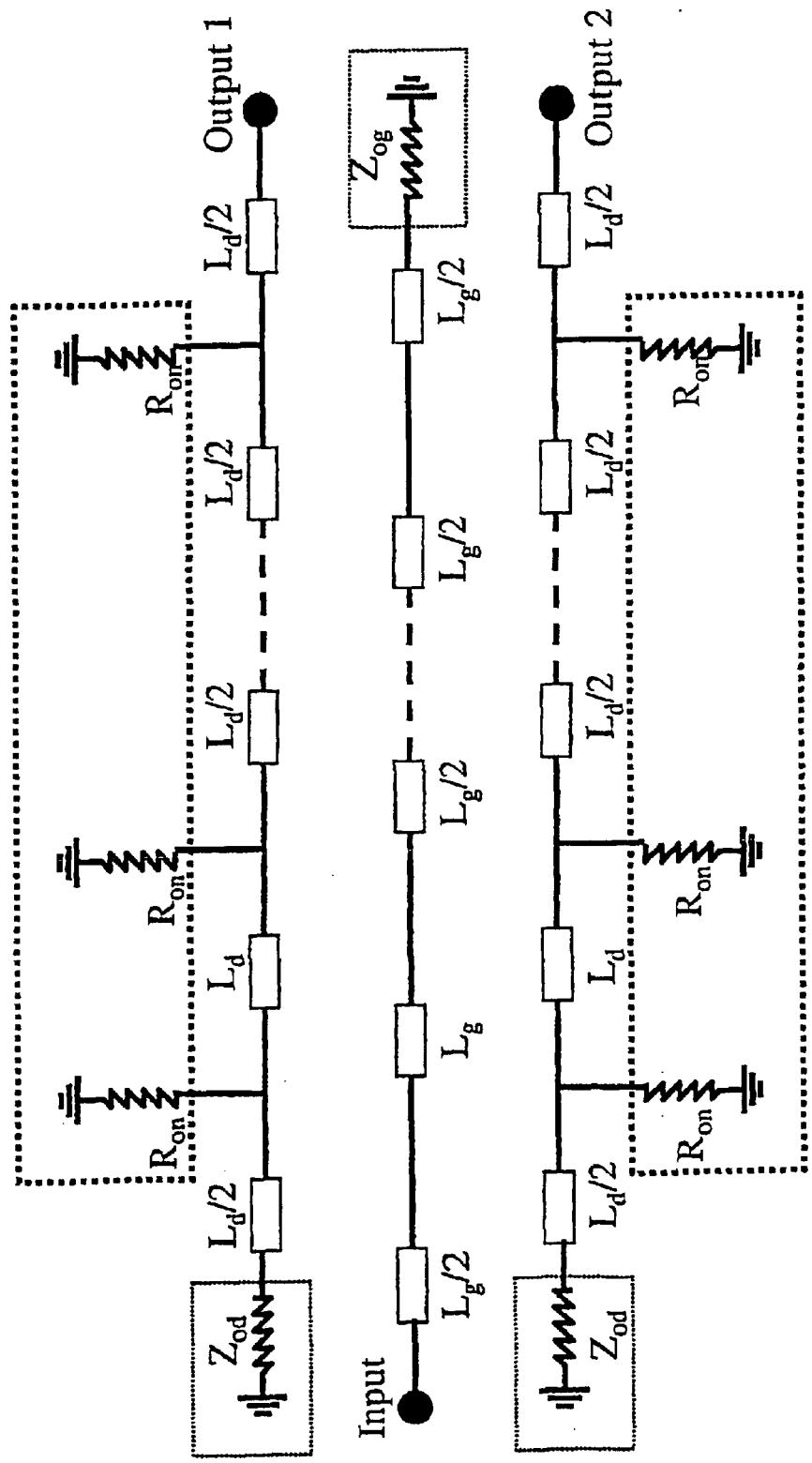
FIG. 6d shows how both output port 1 and output port 2 are shunted in the power splitter in FIG. 5, so that no power reaches any output port ($VC=V_{Low}$, $VC'=V_{Low}$)

When the control voltage to the switching elements for a distributed amplifier is high, the amplifier transmits power, but when the control voltage is low, it does not transmit power. As a result, a reconfigurable active power splitter is obtained, which is illustrated in FIG. 5 and is in this patent application called FC1A.

This circuit thus functions not only as a constant power splitter. It can connect the power to one or the other output port onto both, without deteriorating the matching conditions. The switching elements $ST_i$, i=1, ..., N, are identical and controlled by a common control voltage VC, which is very favourable and desirable. The same applies to the lower switching elements $ST'_i$, i=1, ..., N, in the Figure and their control voltage VC'.

As stated above, a switch transistor corresponds in its high-impedance state, $VC=V_{High}$, to a capacitance $C_{off}$. In its low-impedance state, $VC=V_{Low}$, a switch transistor corresponds to a low resistance $R_{on}$. Depending on the switch state of the switch transistors $ST_i$ nad $ST'_i$, four states are thus possible for the power splitter. This is illustrated in FIGS. 6a–6d.

It should be noted that in FC1A the shunted switch transistors are part of the network itself. In known previous attempts to control the power, a separate switching network has been used in each output port, which is a more complicated and quite inferior method. FC1A is suitably made in MMIC technology, although this is not necessary.

Figure 7:
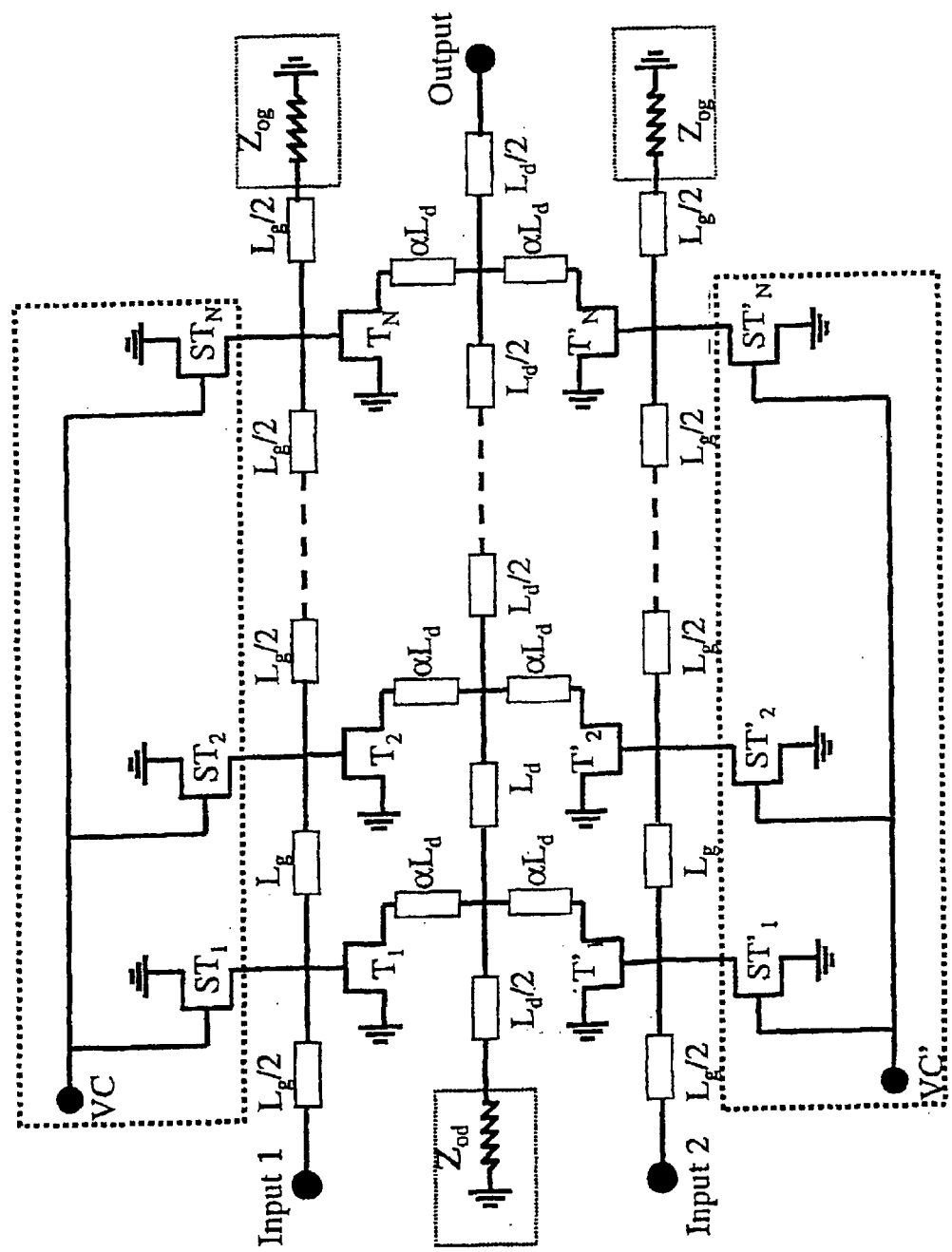
FIG. 7 shows a reconfigurable active power combiner FC1B according to the invention.

A reconfigurable active power combiner FC1B, of a composition, which is closely, related to that of the above-described power splitter, is also part of the invention and is shown in FIG. 7. Based on the circuit solution in FIG. 7 and the discussion about the power splitter FC1A, it is obvious to those skilled in the art how the circuit is made up.

Figure 8:
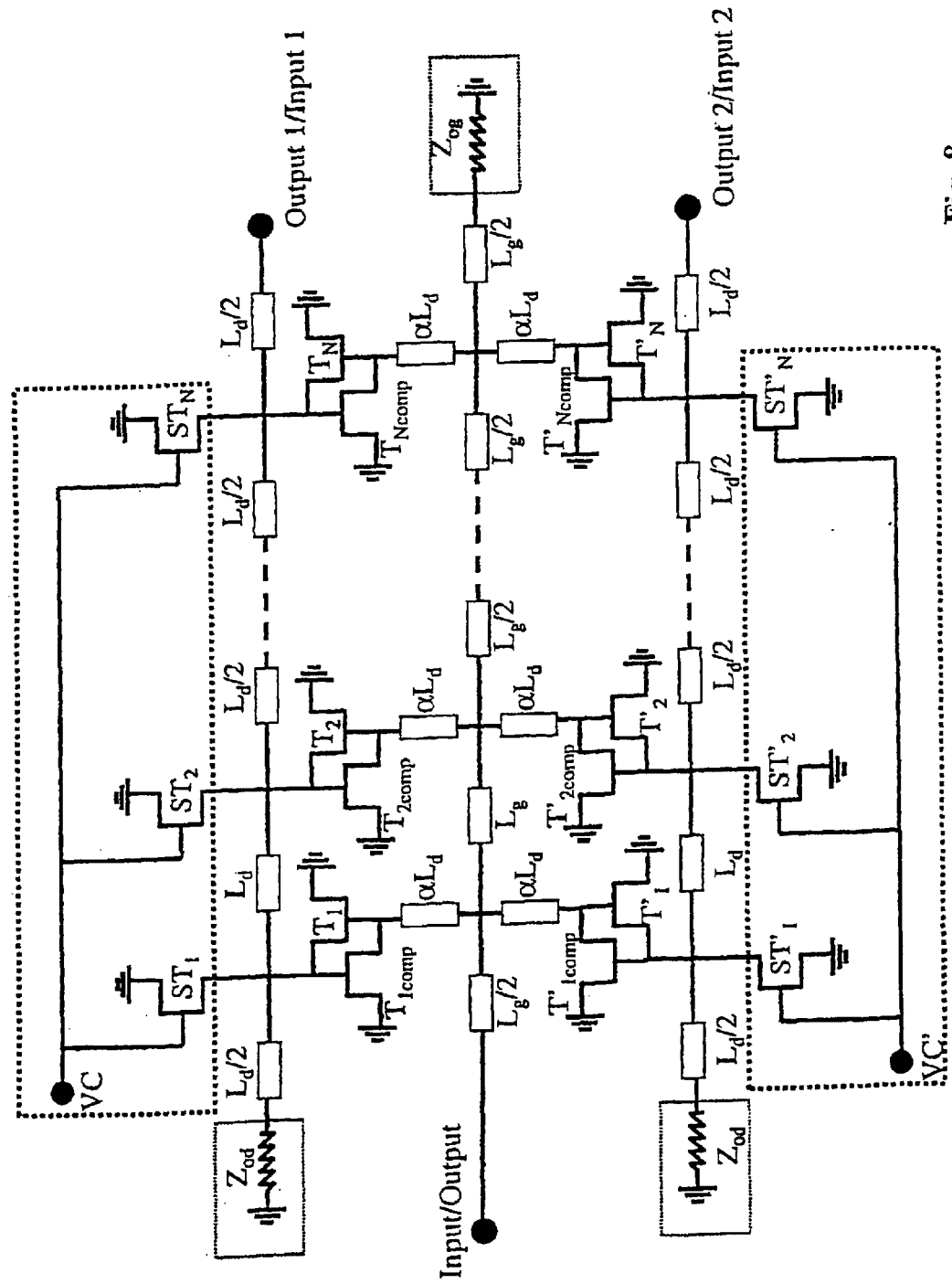
FIG. 8 shows a reconfigurable active bidirectional power splitter/power combiner FC1C according to the invention.

A third circuit according to the invention is a reconfigurable active bidirectional power splitter/power combiner FC1C. It is a combination of FC1A and FC1B in one and the same circuit and is shown in FIG. 8. The transistors $T_i$, $T_{i\ comp}$, $T_i'$, $T_{i\ comp}'$, are active switches. By an active switch is meant a component having two distinct states. A first corresponding to a capacitance network and a second state corresponding to an amplification. The amplification is obtained by a suitable voltage being applied between the drain and the source as well as between the gate and the source.

The transistors $T_i$, $T_{i\ comp}$ are complementary, so that when one takes the first state, the other takes the second state and vice versa. Thus, when the transistors $T_{i\ comp}$ and $T_{i\ comp}'$, i=1, ..., N, are in a high-impedance state, corresponding to a capacitance network, $T_i$ and $T_i'$, i=1, ..., N, are in an amplifying state, and then the entire circuit corresponds to a power splitter. On the other hand, when the transistors $T_i$ and $T_i'$, i=1, ..., N, are in a high-impedance state and $T_{i\ comp}$ and $T_{i\ comp}'$, i=1, ..., N, are in an amplifying state, the entire circuit corresponds to a power combiner.

Figure 9:
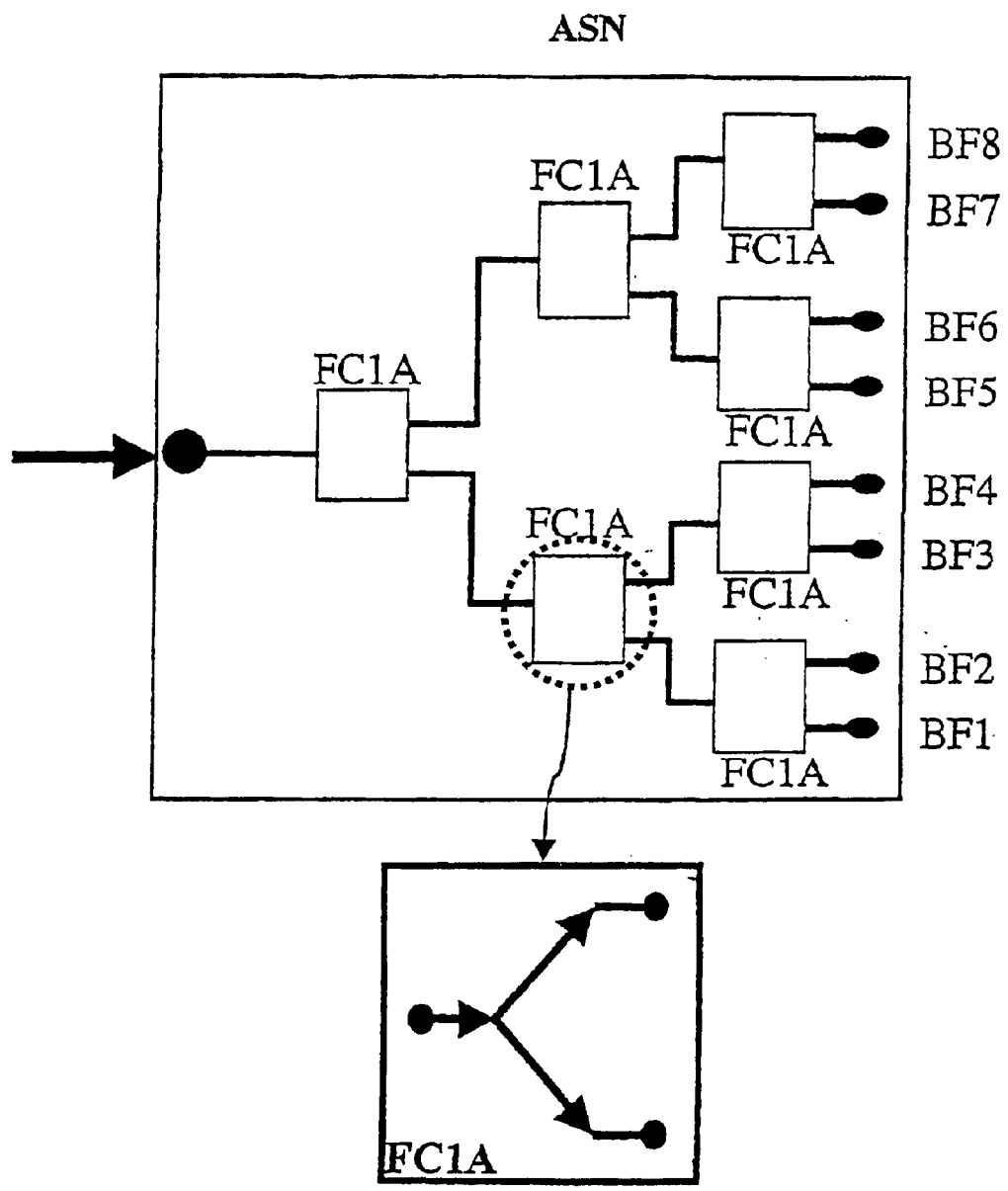
FIG. 9 shows a number of power splitters according to the invention interconnected in a power splitting network ASN.

A number of power splitters FC1A can be interconnected in a power splitting network ASN in order to gradually achieve an increasingly split signal. This is illustrated in FIG. 9. In connection with FIG. 15, a multifunctional broadband electronically steered phased array system will be discussed later in this description. The designation shown in FIG. 9 for the outputs, BF1, ..., BF8, relate to connection points for a number of beam formers BF numbered correspondingly.

Figure 10:
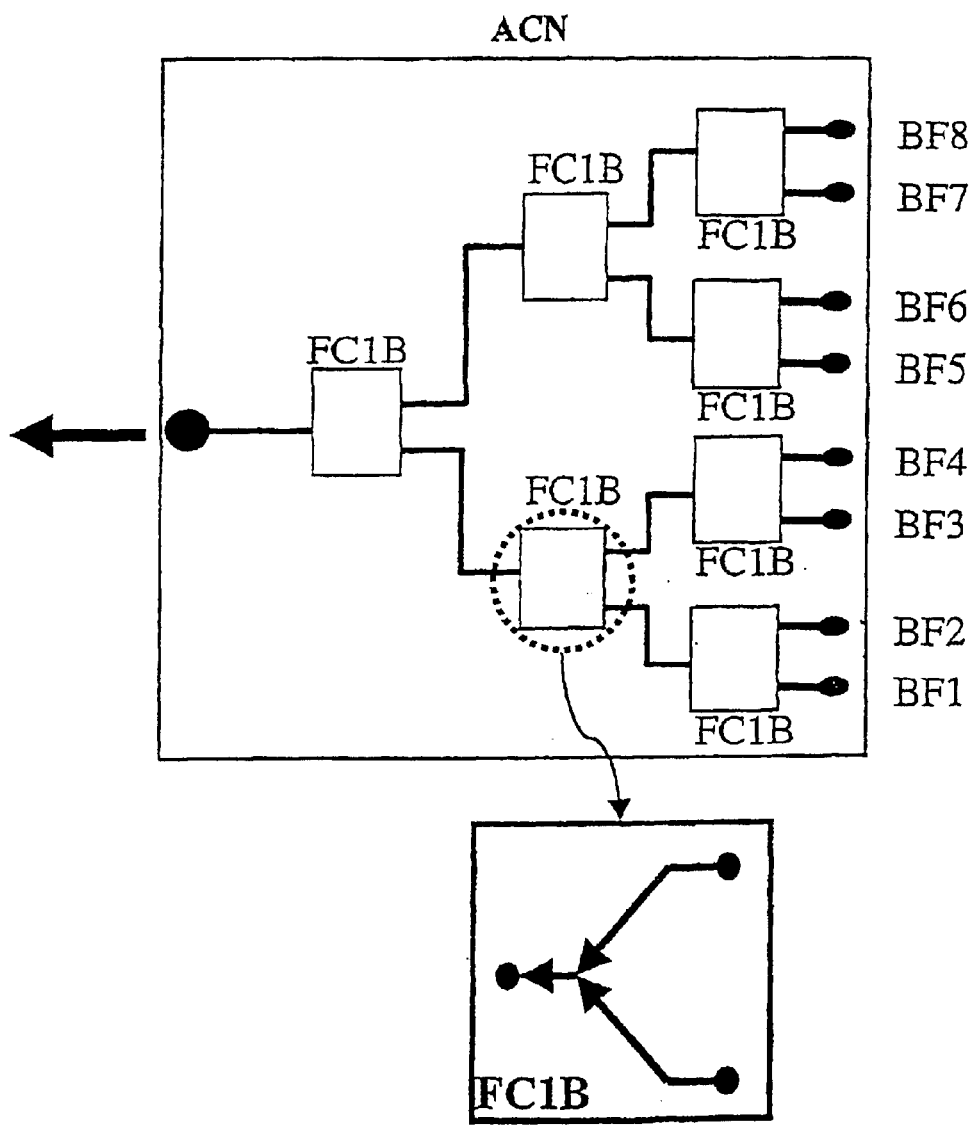
FIG. 10 shows a number of power combiners according to the invention interconnected in a power combining network ACN.

Similarly, a number of combiners FC1B can be interconnected in a power combining network ACN in order to gradually combine the signal to an output. This is illustrated in FIG. 10. Also in this case, the designations of the inputs indicate connection points for these beam formers.

Figure 11:
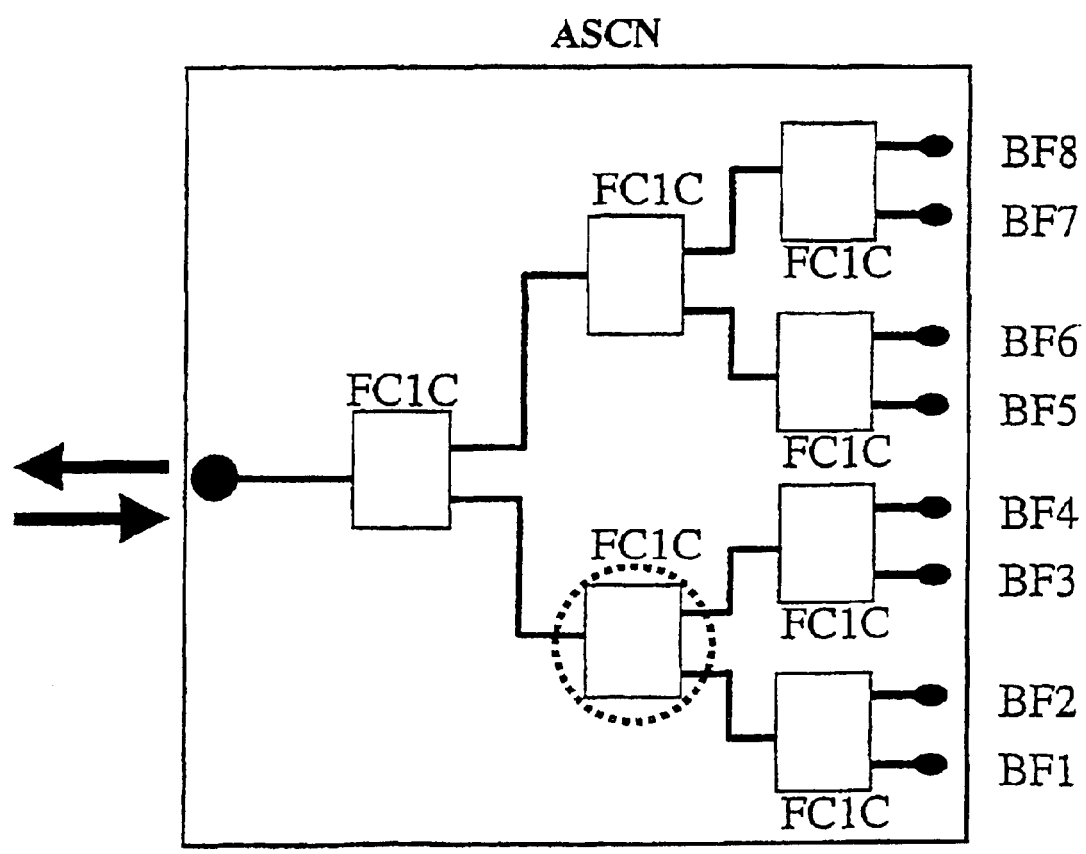
FIG. 11 shows a number of bidirectional power splitters/power combiners according to the invention interconnected in a bidirectional power splitting/power combining network ASCN.

FIG. 11 shows how a number of bidirectional power splitters/power combiners FC1C can be interconnected to form a network ASCN that alternatingly can operate as a power splitting network and a power combining network. Also in this case, the designations of the inputs indicate connection points for the beam formers.

Figure 12:
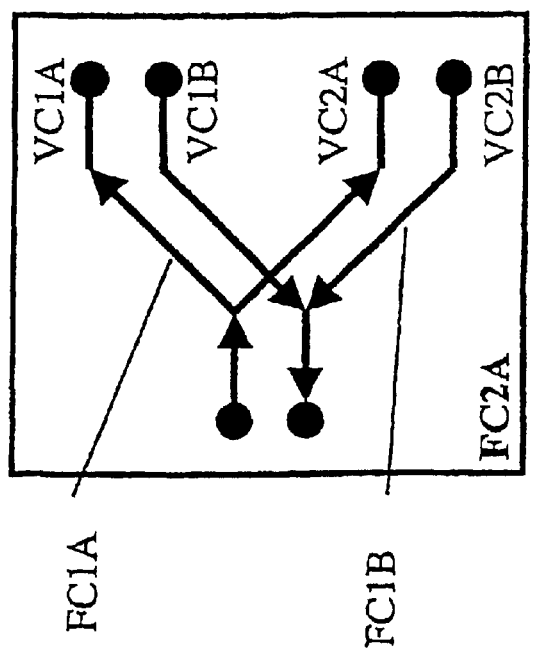
FIG. 12 shows a 6-port distribution network FC2A based on a power splitter and an oppositely directed power combiner.

Furthermore, special combinations of FC1A and FC1B can be formed to be useful in various contexts. A 6-port distribution network FC2A is shown in FIG. 12. It is made up of one FC1A and one oppositely directed FC1B. With four control voltages VC1A, VC1B, VC2A and VC2B, power can be connected in 16 different ways. Compared with FC1C, this solution gives a bidirectional function at the same time.

Figure 13:
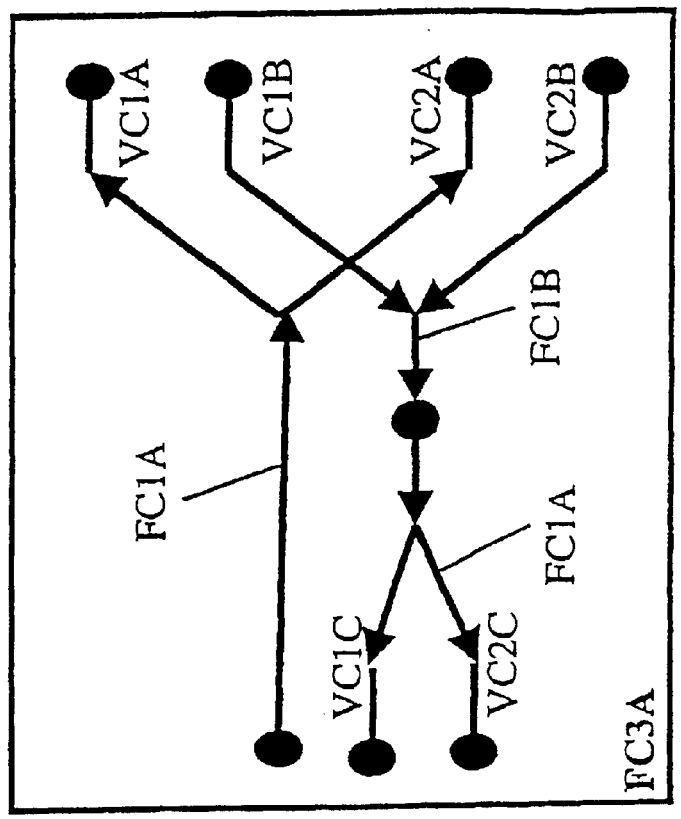
FIG. 13 shows a 7-port distribution network FC3A based on a power splitter in one direction and a power combiner followed by a power splitter in the other direction.

A 7-port distribution network FC3A is shown in FIG. 13. It is made up of one FC1A in one direction and one FC1B followed by one FC1A in the other direction. It uses six control voltages VC1A, VC1B, VC1C, VC2A, VC2B and VC2C to direct power to different ports. The solution indicates a further possibility of generally distributing, parallel in time, power between ports.

Figure 14:
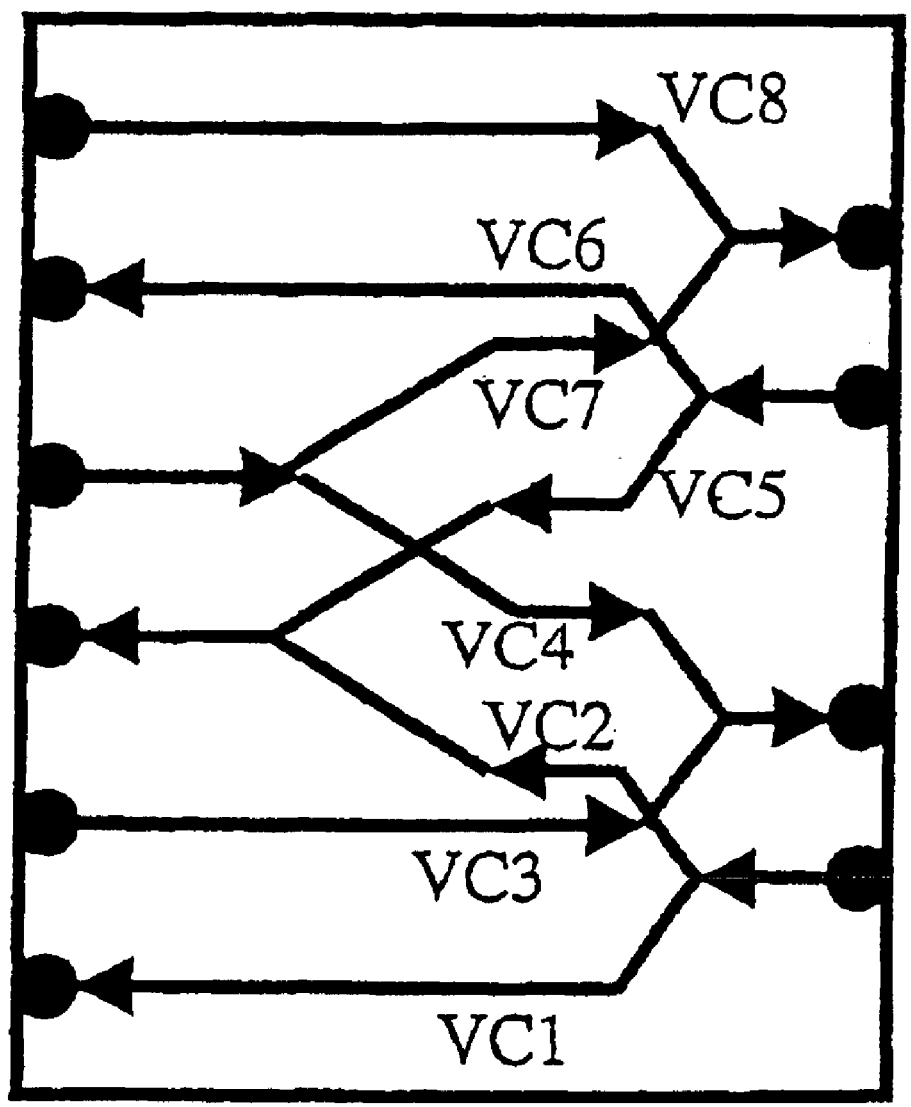
FIG. 14 shows a 10-port distribution network MFAM based on three power splitters and three power combiners.
Figure 16:
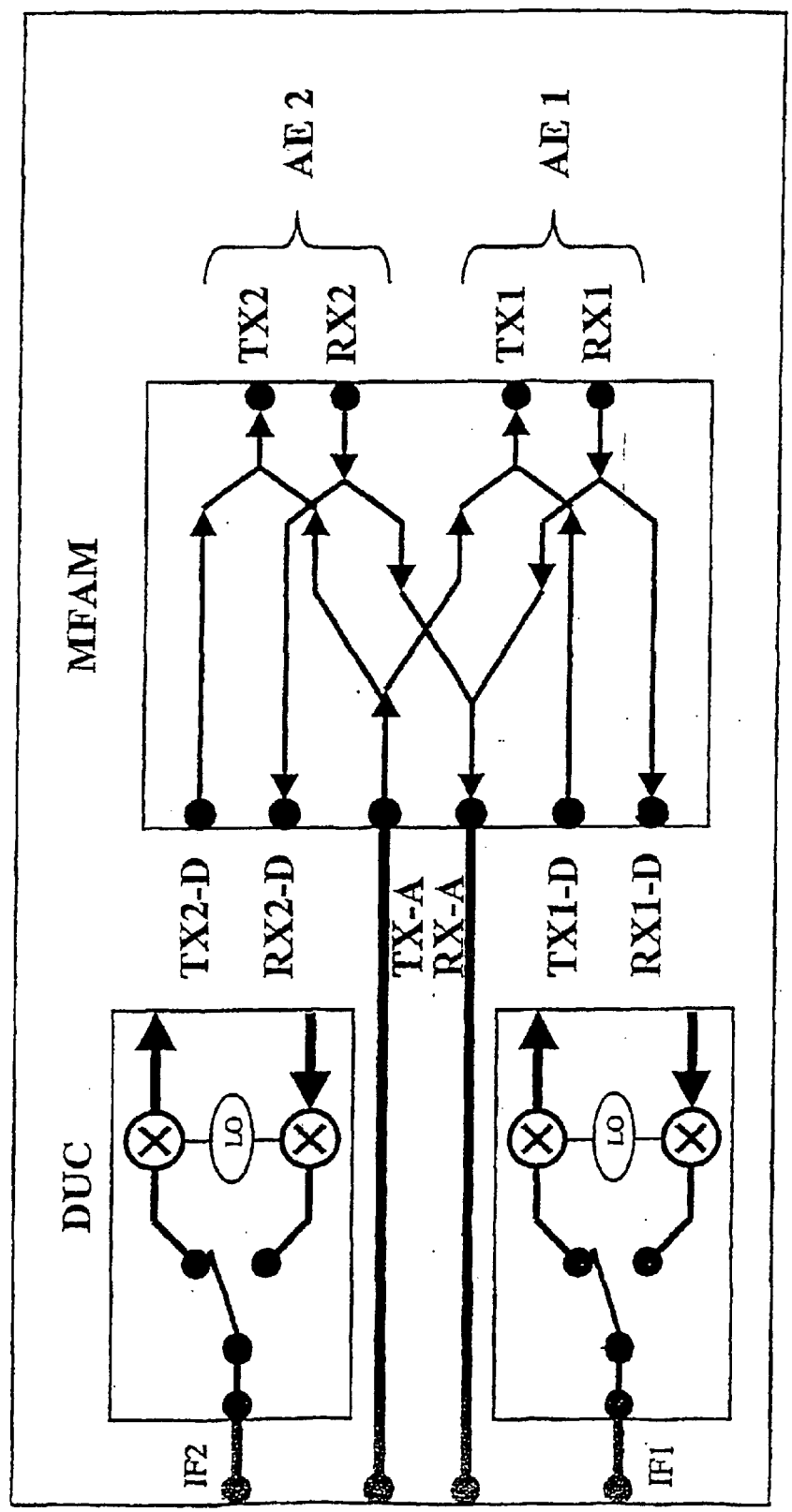
FIG. 16 shows a circuit consisting of a distribution network MFAM according to FIG. 14 and two up and down converters DUC.

A 10-port distribution network MFAM is shown in FIG. 14. It is a more complicated variant of previous networks and is made up of three FC1A and three FC1B. FIG. 16 shows a concrete application of the distribution network MFAM.

Figure 15:
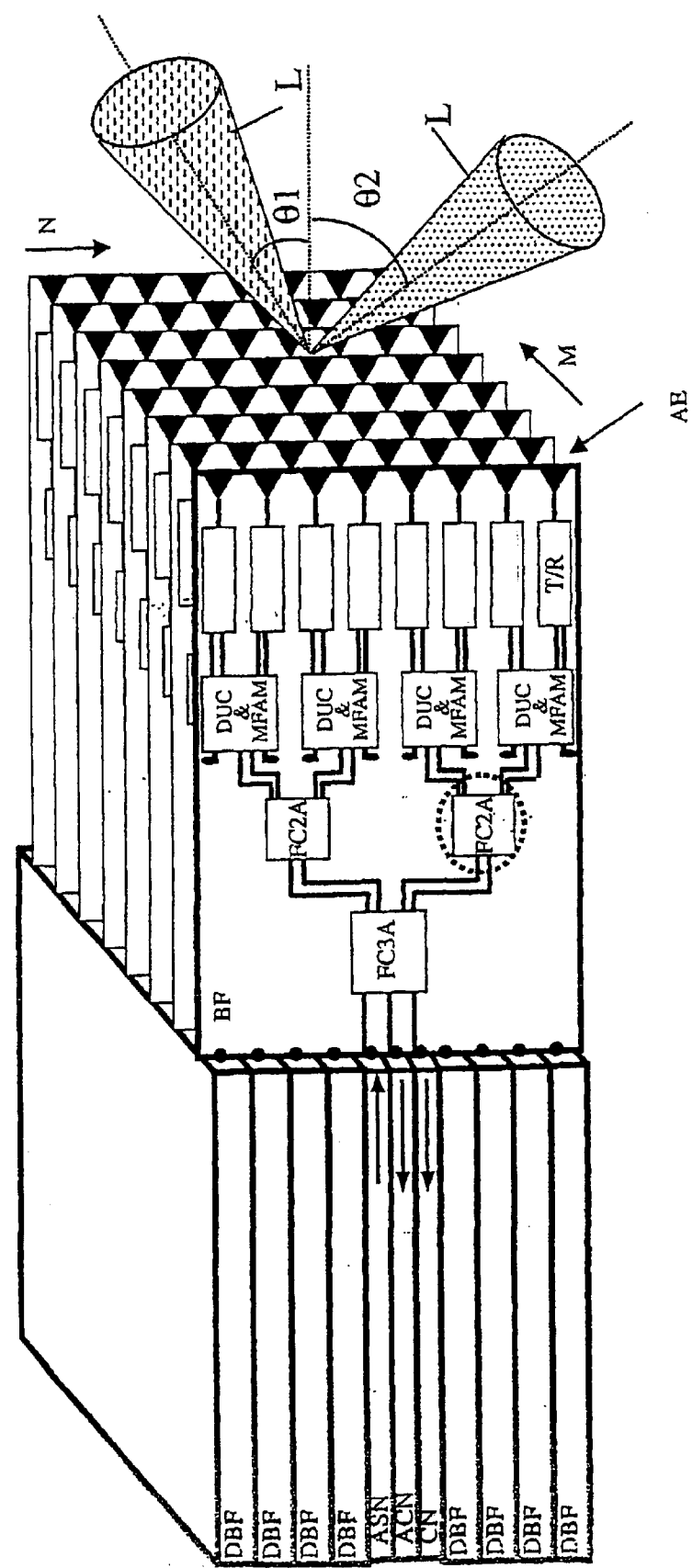
FIG. 15 shows a multifunctional broadband electronically steered phased array system according to, the invention.

At the end of this patent specification, it is time to describe the application that constitutes the base for the present development, namely a multifunctional broadband electronically steered phased array system. Such a system with 8×8 antenna elements is shown in FIG. 15. In general the system can be assumed to have N×M antenna elements. It can, as stated by way of introduction, be connected to signal generation/reception equipment which is not shown in the Figure but is assumed to be located "to the left of" the same. The signal generation/reception equipment performs, simultaneously or in rapid succession, traditional radar functions, multilobe direction finding, exchange of data messages and other communication, transmission of jamming signals etc.

The system comprises M identical beam formers BF in a modular mode) to send broadband signals from the signal generation/reception equipment to the phased array antenna elements AE and vice versa. The beams are marked L in the Figure and their angles are marked θ1 and θ2. The beam formers consist, seen from the antenna elements, of one transceiver module T/R per antenna element. Two such T/R modules are connected to a circuit consisting of one MFAM and two up and down converters DUC. This circuit is shown in FIG. 16. AE1 and AE2 relate to antenna element 1 and 2. Signals to the antenna elements are called TX1 and TX2, and signals from the same are called RX1 and RX2. On the other side of MFAM there are ports on the one hand for digital signals TX1-D and RX1-D to and respectively from TX1 and RX1 and the equivalent for TX2 and RX2 and, on the other hand, ports for analog signals Tx-A and RX-A to and respectively from the antenna elements involved. The signal after the up and down converters DUC is called IF1 and IF2.

A number of different blocks for different functions, such as digital beam-forming and chanalisation, can be connected to the beam former BF which gives conventional analog beam forming. Since it is easy to direct signals to the two outputs in the basic circuits and, thus, also to and from the different inputs and outputs of the compound circuits which are made up of these basic circuits, it is possible to use the aperture of the entire antenna system for a function or, during certain periods of time, share the aperture among different functions.

The chanalisation network CN, which can be connected to the beam former, is made up of a combination of digital and analog circuits and is used, for instance, in the signal intelligence function to provide direction finding and position finding.

A power splitting network ASN and a power combining network ACN and/or a bidirectional network ASCN can also be connected to the beam-forming network. These networks are used to split and combine the signal from the entire antenna aperture or parts thereof.

Digital beam formers DBF can also be connected to the previously mentioned conventional (analog) beam-forming network. These digital beam formers are used, for instance, when side lobes need to be suppressed adaptively. The signal from each individual antenna element has its own channel and the digital beam former has the same number of inputs/outputs as the number of antenna elements.

In the conventional beam formers BF, a circuit of the type FC2A is connected to two circuits of the above-mentioned type consisting of one MFAM and two up and down converters. In the example involving 8×8 elements in the antenna matrix, a circuit FC3A follows the circuits FC2A, see FIG. 15. With a larger number of elements in the matrix, it is possible to use a network of circuits FC2A instead of a single circuit FC2A.

FC3A are used for analog beam forming, but they can be reconfigured to carry out switching functions for the chanalisation of the matrix and port termination. Also the MFAM circuit is used in the beam former BF for analog beam forming, but can be reconfigured to carry out switching functions for both analog and digital beam forming of the matrix.

The network ASN, which according to FIG. 15 can be connected to the analog beam former BF, is not only a distributed active power splitter. It can also be used as a switching element that allows a split antenna and use of more than one function. The same applies to ACN as power combiner.

With the aid of the chanalisation network CN, M channels are formed, each connected to a beam former BF. With the aid of MFAM, FC2A and FC3A in the beam former, the information from all elements connected to the beam former or only information from one or a small number of selected antenna elements can be selected.

As indicated, digital beam formers DBF can be connected to the analog beam formers BF. The digital beam-forming network consists of M×N channels (in this example 8×8=64 channels) and each channel consists of circuits handling both analog and digital signals. It converts down the RF signal to the base band, AD converts the signal and processes it. By means of MFAM in the analog beam former, the information from each individual antenna element can be directed to a separate channel for digital beam forming.

Figure 17:
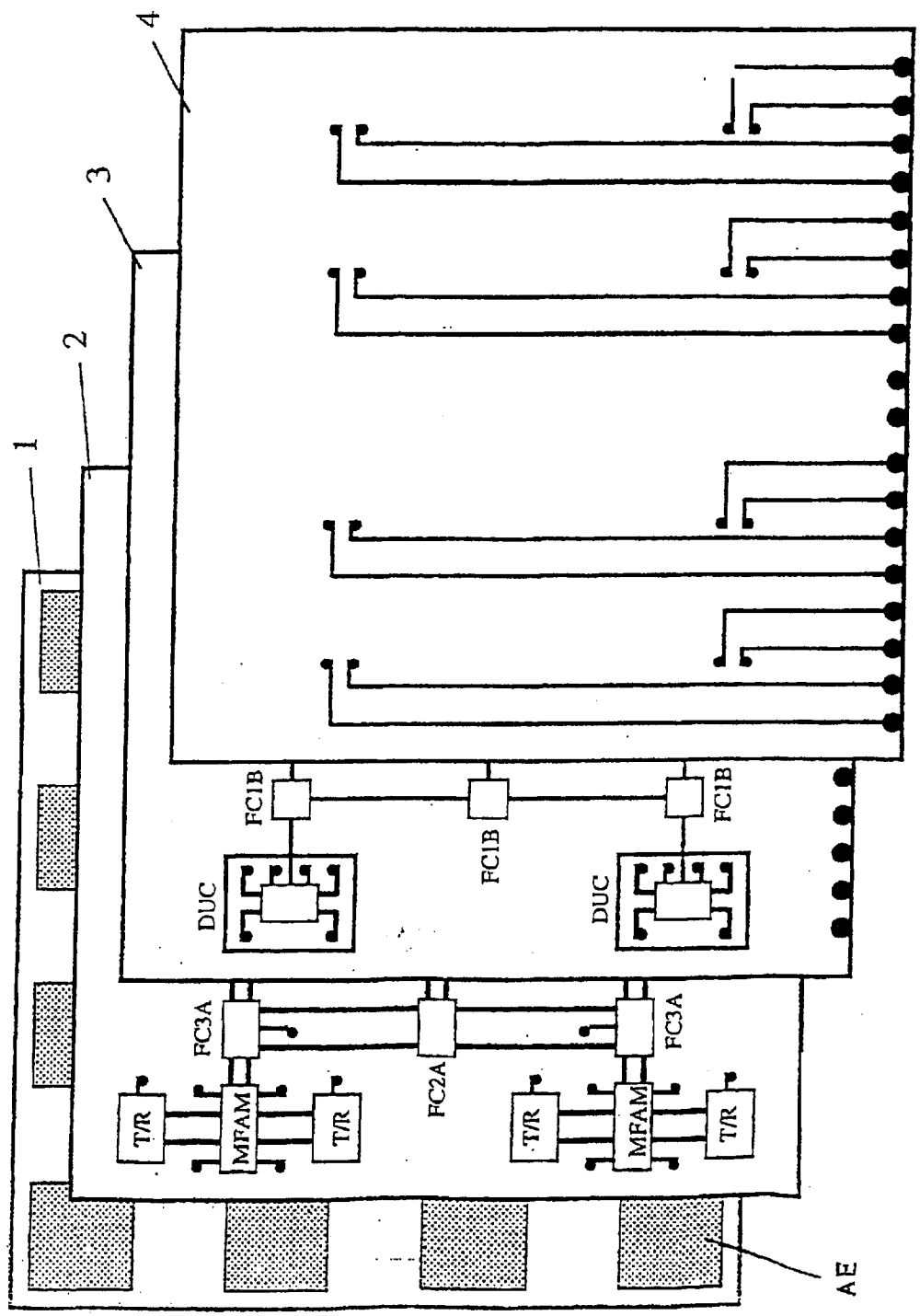
FIG. 17 shows how a phased array system according to FIG. 15 can be made in planar multilayer technology.

FIG. 17 shows a method of making the system in planar multilayer technology, where each layer corresponds to a function in the antenna matrix. Layer 1 contains antenna elements AE. Layer 2 comprises beam formers BF and layer 3 comprises local oscillator and up and down converting circuits. Layer 4 distributes IF and RF signals. An embodiment in planar multilayer technology allows good adaptation to the surface of a platform body.

What is claimed is:

1. A broadband active power circuit comprising:
   A. at least one circuit input and at least one circuit output, wherein the number of circuit inputs are different from the number of circuit outputs;
   B. two distributed amplifiers connected to the at least one circuit input and the at least one circuit output, each distributed amplifier being defined by
      a. plurality of amplifying elements, each amplifying element having an input connection point and an output connection point,
      b. first artificial transmission lines connected to the input connection points of the amplifying elements, each of the first artificial transmission lines consisting of an inductance located between a pair of input connection points,
      c. second artificial transmission lines connected to the output connection points of the amplifying elements, each of the second artificial transmission lines consisting of an inductance located between a pair of output connection points,
      d. a first parallel capacitances across the amplifying elements, between the input connection points and ground,
      e. second parallel capacitances across the amplifying elements, between the output connection points and ground; and
   C. a switching element connected between each output connection point and ground and/or between each input connection point and ground, said switching elements operative in two states in response to a control voltage, a first state corresponding to a capacitance and a second state corresponding to a low impedance short circuit.

2. The broadband active power circuit of claim 1, wherein the number of circuit inputs is one whereby the broadband active power circuit is a power splitter.

3. The broadband active power circuit of claim 1, wherein the number of device outputs is one whereby the broadband active power circuit is a power combiner.

4. The broadband active power circuit of claim 1, wherein the switching elements are operated so that the broadband active power circuit operates in two modes as a bidirectional power splitter/power combiner, the first mode providing a power splitter having one circuit input and two circuit outputs and the second mode providing a power combiner having two circuit inputs and one circuit output.

5. The broadband active power circuit of claim 1, wherein each amplifying element further comprises complementarily connected amplifying components having a first state corresponding to a capacitance network and a second state corresponding to an amplification.

6. The broadband active power circuit of claim 1, wherein the amplifying elements are implemented as field effect transistors.

7. The broadband active power circuit of claim 1, wherein the switching elements are field effect transistors.

8. A distribution network comprising a plurality of bidirectional power splitter/power combiners with two ports operative as circuit inputs in a first mode and circuit outputs in a second mode and a single port operative as a circuit output in the first mode and a circuit input in the second mode, wherein each bidirectional power splitter/power combiner comprises,
   A. at least one circuit input and at least one circuit output, wherein the number of circuit inputs are different from the number of circuit outputs;
   B. two distributed amplifiers connected to the at least one circuit input and the at least one circuit output, each distributed amplifier being defined by
      a. a plurality of amplifying elements, each amplifying element having an input connection point and an output connection point,
      b. first artificial transmission lines connected to the input connection points of the amplifying elements, each of the first artificial transmission lines consisting of an inductance located between a pair of input connection points,
      c. second artificial transmission lines connected to the input connection points of the amplifying elements, each of the second artificial transmission lines consisting of an inductance located between a pair of input connection points,
      d. first parallel capacitances across the amplifying elements, between the input connection points and ground,
      e. second parallel capacitance across the amplifying elements, between the output connection points and ground; and
   C. a switching element connected between each output connection point and ground and/or between each input connection point and ground, said switching elements operative in two states in response to a control voltage, a first state corresponding to a capacitance and a second state corresponding to a low impedance short circuit, and wherein each switching element operates so that the broadband active power circuit operates in two modes as a bidirectional power splitter/power combine, the first mode providing a power splitter having one circuit input and two circuit outputs and the second mode providing a power combiner having two circuit inputs and one circuit output; and D. wherein for each of the two ports of a bidirectional power splitter/power combiner, the single port from a remaining one of the bidirectional power splitter/power combiners is connected.

9. A multifunctional broadband electronically steered phase array system for connection to signal generation/reception equipment, said phase array system comprising:

an array of antenna elements arranged in a matrix, and analog beam-forming circuits for transferring broadband signals back and forth between the signal generation/reception equipment and the array of antenna elements, each of the analog beam-forming circuits including A. at least one circuit input and at least one circuit output, wherein the number of circuit inputs are different from the number of circuit outputs;

B. two distributed amplifiers connected to the at least one circuit input and the at least one circuit output, each distributed amplifier being defined by
 a. a plurality of amplifying elements, each amplifying element having an input connection point and an output connection point,
 b. first artificial transmission lines connected to the input connection points of the amplifying elements, each of the first artificial transmission lines consisting of an inductance located between a pair of input connection points,
 c. second artificial transmission lines connected to the output connection points of the amplifying elements, each of the second artificial transmission lines consisting of an inductance located between a pair of output connection points,
 d. first parallel capacitances across the amplifying elements, between the input connection points and ground,
 e. second parallel capacitances across the amplifying elements, between the output connection points and ground; and C. a switching element connected between each output connection point and ground and/or between each input connection point and ground, said switching elements operative in two states in response to a control voltage, a first state corresponding to a capacitance and a second state corresponding to a low impedance short circuit, which assures that, when the control voltage is high for one of the distributed amplifiers, the selected amplifier transmits power, and, when the control is low for one of the distributed amplifiers, the selected amplifier does not transmit power.

10. A phased array system of claim 9, wherein the system is made in a plurality of planar layers.

11. A distribution network comprising:

a plurality of broadband active power circuits wherein each broadband active power circuit comprises
 a. at least one circuit input and at least one circuit output, wherein the number of circuit inputs are different from the number of circuit outputs;
 b. two distributed amplifiers connected to the at least one circuit input and the at least one circuit output, each distributed amplifier being defined by
  i. a plurality of amplifying elements, each amplifying element having an input connection point and an output connection point,
  ii. first artificial transmission lines connected to the input connection points of the amplifying elements, each of the first artificial transmission lines consisting of an inductance located between a pair of input connection points,
  iii. second artificial transmission lines connected to the output connection points of the amplifying elements, each of the second artificial transmission lines consisting of an inductance located between a pair of output connection points,
  iv. first parallel capacitances across the amplifying elements, between the input connection points and ground,
  v. second parallel capacitances across the amplifying elements, between the output connection points and ground; and
 C. a switching element connected between each output connection point and ground and/or between each input connection point and ground, said switching elements operative in two states in response to a control voltage, a first state corresponding to a capacitance and a second state corresponding to a low impedance short circuit, which assures that, when the control voltage is high for one of the distributed amplifiers, the selected amplifier transmits power, and, when the control is low for one of the distributed amplifiers, the selected amplifier does not transmit power.

12. The distribution network of claim 11, wherein each broadband active power circuit is a power splitter with one circuit input and two circuit outputs and wherein for each output of a power splitter, the input of another power splitter is connected to produce a power splitting network.

13. The distribution network of claim 11, wherein each broadband active power circuit is a power combiner with two circuit inputs and one circuit output and wherein for each input of a power combiner, the output of another power combiner is connected to produce a power combining network.

14. The distribution network of claim 11, wherein at least one of the broadband active power circuits is a power splitter with one circuit input and two circuit outputs and at least another one of the broadband active power circuits is a power combiner with two circuit inputs and one circuit output, wherein the power combiners and the power splitters are operatively connected to define a six port network.

15. The distribution network of claim 14, wherein the power combiners and the power splitters are operatively connected to define a seven port network.

* * * * *

UNITED STATES PATENT AND TRADEMARK OFFICE
CERTIFICATE OF CORRECTION

PATENT NO. : 6,900,695 B2  
APPLICATION NO. : 10/416504  
DATED : May 31, 2005  
INVENTOR(S) : Ouacha Page 1 of 1

It is certified that error appears in the above-identified patent and that said Letters Patent is hereby corrected as shown below:

Col. 8, line 45: change "input" to --output--

Col. 8, line 48: change "input" to --output--

Signed and Sealed this

Twenty-second Day of December, 2009

David J. Kappos  
*Director of the United States Patent and Trademark Office*